United States Patent [19]

Schlosser et al.

[11] Patent Number: 5,312,719
[45] Date of Patent: May 17, 1994

[54] DEVELOPING SOLVENT FOR LAYERS WHICH ARE CROSSLINKABLE BY PHOTOPOLYMERIZATION AND PROCESS FOR THE PRODUCTION OF RELIEF FORMS

[75] Inventors: Hans-Joachim Schlosser; Guenther Schoen, both of Wiesbaden, Fed. Rep. of Germany

[73] Assignee: E. I. Du Pont de Nemours and Company

[21] Appl. No.: 20,173

[22] Filed: Feb. 22, 1993

Related U.S. Application Data

[60] Continuation of Ser. No. 807,615, Dec. 13, 1991, abandoned, which is a continuation of Ser. No. 540,792, Jun. 20, 1990, abandoned, which is a division of Ser. No. 426,413, Oct. 26, 1989, abandoned.

[30] Foreign Application Priority Data

Oct. 26, 1988 [DE] Fed. Rep. of Germany ....... 3836403

[51] Int. Cl.$^5$ ................................................. G03F 7/32
[52] U.S. Cl. ..................................... 430/325; 430/331
[58] Field of Search ................. 430/325, 331, 330, 328

[56] References Cited

U.S. PATENT DOCUMENTS

| | | | |
|---|---|---|---|
| 2,760,863 | 8/1956 | Plambeck, Jr. | 430/281 |
| 3,656,951 | 4/1972 | Anderson et al. | 430/302 X |
| 4,070,203 | 1/1978 | Neisius et al. | 134/3 |
| 4,400,459 | 8/1983 | Gruetzmacher et al. | 430/331 X |
| 4,943,516 | 7/1990 | Kamayachi et al. | 430/286 X |
| 5,176,986 | 1/1993 | Telser et al. | 430/306 |

FOREIGN PATENT DOCUMENTS

| | | |
|---|---|---|
| 3908763 | 9/1990 | Fed. Rep. of Germany . |
| 2163896 | 7/1973 | France . |
| 2455076 | 11/1980 | France . |
| 58-137836 | 8/1983 | Japan . |
| 59-37950 | 8/1984 | Japan ........................ 430/325 |

OTHER PUBLICATIONS

Chemical Abstracts, vol. 96, No. 96:26858t, 1982.

*Primary Examiner*—Christopher Rodee
*Attorney, Agent, or Firm*—Foley & Lardner

[57] ABSTRACT

The invention describes a developing solvent for layers which are crosslinkable by photopolymerization and contain a binder based on an elastomeric polymer, a photopolymerizable monomer compatible therewith and a photoinitiator. The developing solvent comprises an aromatic compound of the general formula I

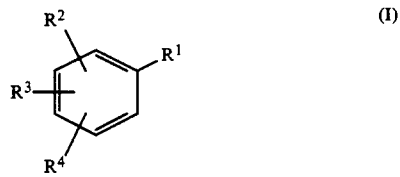

wherein
$R^1$ to $R^4$ are the same or different and denote hydrogen, $(C_1-C_5)$n-alkyl or iso-alkyl and $R^1$ and $R^2$, provided that $R^1$ and $R^2$ are directly adjacent, may also form a cycloaliphatic or aromatic ring having 5 or 6 carbon atoms as ring members which are preferably non-substituted, provided that the sum of carbon atoms of the substituents and ring members is from 9 to 13. Compared with solvents of the prior art, the developing solvent of the present invention is non-toxic, can quickly be removed from the layer, has a high capacity for layer components and is capable of developing plates based on nitrile rubber.

17 Claims, No Drawings

DEVELOPING SOLVENT FOR LAYERS WHICH ARE CROSSLINKABLE BY PHOTOPOLYMERIZATION AND PROCESS FOR THE PRODUCTION OF RELIEF FORMS

This application is a continuation of application Ser. No. 07/807,615, filed Dec. 13, 1991 abandoned, which in turn is a continuation of application Ser. No. 07/540,792, filed Jun. 20, 1990 abandoned, which in turn is a divisional of application Ser. No. 07/426,413, filed Oct. 26, 1989 abandoned.

BACKGROUND OF THE INVENTION

The invention relates to a developing solvent for layers which are crosslinkable by photopolymerization and contain a binder based on an elastomeric polymer, a photopolymerizable monomer compatible therewith and a photoinitiator.

It has long been known to produce relief forms, in particular flexographic printing plates, by means of photopolymerization-crosslinkable layers which are exposed imagewise and thereafter developed and washed out.

For the production of these forms, the photopolymer layer is exposed imagewise to actinic light; a relief can then be formed by washing off the non-exposed and thus non-crosslinked portions of the layer, using a developing solvent. The developing solvent should dissolve the non-crosslinked portions of the layer as quickly as possible, and the solvent must be removable with greatest possible ease from the crosslinked portions of the layer, so that the plate is rapidly dried. For this reason, low-boiling developing solvents presently are generally used.

Examples of preferred solvents which are described in DE-A 22 15 090 include methyl ethyl ketone, benzene, toluene, xylene, carbon tetrachloride, trichloroethane, trichlcoroethylene, methyl chloroform and tetrachloroethane, and mixtures of these.

It is a disadvantage of the above-indicated chlorinated hydrocarbons that they are toxic and give rise to disposal problems. If chlorinated hydrocarbons are used as developing solvents, the portions of the layer which are to be removed swell very strongly while still on the plate and as the concentration of dissolved components of the non-crosslinked layer portions increases in the developing solvent, viscosity of the solvent rises sharply. As a result, the capacity of the developing solvent is very limited and the solvent is rendered useless, already at a solids content of 5%. A further consequence of the strong increase in viscosity is that plates develop very slowly even at less than 5% solids content. In addition, development of plates which contain nitrile rubbers as the elastomers is very slow.

Of the non-chlorinated hydrocarbons specified in DE-A 22 15 090 benzene, toluene and xylene are mentioned. These solvents have the disadvantage of being easily flammable, moreover, they lead to severe swelling of the layer and, consequently, to slow developing and drying of the plate.

Additionally, due to their low flash-point, these solvents cannot be used in developing apparatuses which are not explosion-proof.

DE-A 36 00 116 describes relatively highly boiling developing solvents which contain hydrocarbons, alcohols or ketones which are branched, or cyclic with one or three olefinic double bonds, or saturated, or cycloaliphatic with one to three olefinic double bonds. Monoterpenes are mentioned in particular. Limonene which is used in the example may have good developing characteristics, but is sensitive to oxygen and irritates the skin, properties which should not be present in a developing solvent. It is also a disadvantage of limonene that it permits only very slow development and is difficult to remove from the layer. Furthermore, plates containing nitrile rubbers cannot be developed within reasonable time.

SUMMARY OF THE INVENTION

It is therefore an object of the present invention to provide a developing solvent for photopolymer layers, which is non-toxic, has a high flash-point, can be removed from the layer as completely and quickly as possible, without giving rise to swelling of the layer and shows the smallest possible increase in viscosity when taking up components of the layer, so that it is possible to develop quickly and faultlessly, irrespective of high capacity requirements and produces speedy developing of plates which contain nitrile rubbers as the elastomers.

It is also an object of the invention to provide a process for the production of photopolymerization-crosslinked relief forms which employs the developing solvent according to the present invention.

In accomplishing these objects there has been provided a developing solvent, comprising an aromatic compound of the general formula I

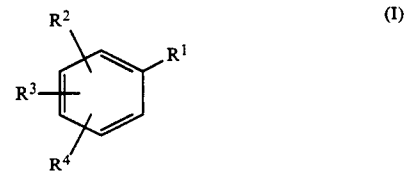

wherein $R^1$ to $R^4$ are the same or different and denote hydrogen, $(C_1-C_4)$n-alkyl or iso-alkyl and $R^1$ and $R^2$, provided that $R^1$ and $R^2$ are directly adjacent, may also form a cycloaliphatic or aromatic ring having 5 or 6 carbon atoms as ring members which are preferably non-substituted, provided that the sum of carbon atoms of the substituents and ring members is from 9 to 13.

Further objects, features and advantages of the present invention will become apparent from the detailed description of preferred embodiments that follows.

DETAILED DESCRIPTION OF THE PREFERRED EMBODIMENTS

Particularly preferred are aromatic compound of the general formula I, in which the number of carbon atoms is from 9 to 11 (in particular 9 or 10).

Likewise preferred are those aromatic compounds of the general formula I, in which the sum of the carbon atoms in the substituents is from 3 to 5, provided that $R^1$ and $R^2$ are not closed to form a cycloaliphatic or cycloaromatic ring. In that case, the sum of carbon atoms of the remaining radicals R is zero, i.e., $R^3$ and $R^4$ denote hydrogen.

As ring systems which may be formed by bridging the radicals $R^1$ and $R^2$, indan, indene, naphthalene and tetralin are mentioned. Preference is, however, given to the Cg-ring systems indan and indene.

If the sum of carbon atoms in the substituents is 5, this number 5 is preferably reached by a single pentyl radical (e.g. $R^1$=pentyl), while $R^2$ to $R^4$ denote hydrogen.

If the sum of carbon atoms in the substituents is 3, this number preferably results from three methyl groups, one methyl group and one ethyl group or one propyl group.

If the sum of carbon atoms in the substituents is 4, this number results from four methyl groups, one methyl group and one propyl group, two ethyl groups, two methyl groups and one ethyl group or one butyl group.

The following aromatic compounds are particularly preferred:

Iso-propylbenzene, n-propylbenzene, 1-methyl-3-ethylbenzene, 1,3,5-trimethylbenzene, 1-methyl-2-ethylbenzene, 1,2,4-trimethylbenzene, isobutylbenzene, sec-butylbenzene, 1,2,3-trimethylbenzene, 1-methyl-4-isopropylbenzene, indan, indene, 1,3-diethylbenzene, 1-methyl-4-propylbenzene, n-butylbenzene, 1-methyl-3-propylbenzene, 1,2,4,5-tetramethylbenzene, dimethylethylbenzene, methylindan, n-pentylbenzene.

The developing solvent of the present invention can contain aromatic compounds of the general formula I, either individually or in the form of a mixture of various aromatic compounds corresponding to the general formula I.

The developing solvent according to the invention comprises from about 55 to 100% by weight, particularly from about 55 to 90% by weight, of aromatic compounds of the general formula I.

Apart from the compounds of the general formula I, the developing solvent of this invention may contain other solvents as additions, particularly if the polymer layer carries an additional polyamide-containing protective layer. In this event, alcohols, especially relatively highly boiling alcohols, are preferred for use as additional solvents.

The principal constituents of the photopolymerization-crosslinkable layers which are to be developed using the developing solvent of the present invention comprise a binder based on an elastomeric polymer, a photopolymerizable monomer which is compatible with the binder, and a photoinitiator. The layers may also comprise various other binders, monomers or photoinitiators.

Additions which may be contained in the layers include dyes, pigments, anti-halation agents, antioxidants, plasticizers, antiozonants, crosslinking agents, regulators, fillers, levelling agents and other agents which improve the action of the layers.

Further auxiliary agents which may be added to the above-described layer are, for example, inhibitors to prevent thermal polymerization, such as hydroquinone and its derivatives, 2,6-di-tert.-butyl-p-cresol, nitrophenols, nitrosamines, such as N-nitrosodiphenylamine, or salts of N-nitrosocyclohexylhydroxylamine, e.g., the alkali metal or aluminum salts thereof.

Particularly preferred layers which are crosslinkable by photopolymerization are those which contain binders comprising polymers of conjugated aliphatic dienes, the monomer units of which have 4 to 5 carbon atoms. Among these the following are particularly mentioned: natural rubber, homopolymers of butadiene and isoprene, copolymers of butadiene and isoprene, copolymers of butadiene and/or isoprene with other monomers, such as styrene, vinyl toluene, acrylonitrile, or (meth)acrylic alkyl esters, for example, nitrile rubbers according to EP-A 064 564, random copolymers of styrene/butadiene, styrene/isoprene, and styrene/isoprene/butadiene, or block polymers of styrene monomers and butadiene and/or isoprene having a styrene content of about 10 to 50% by weight. Elastomers of this kind are described in DE-B 22 15 090, DE-A 24 56 439, DE-A 29 42 183, and DE-A 21 38 582.

The layers which are crosslinkable by photopolymerization generally contain from about 20 to 95% by weight, preferably from about 30 to 95% by weight, of binder.

Preferred monomers having one or more polymerizable olefinic double bonds are, in particular, esters and amides of acrylic and methacrylic acid. Examples are the compatible mono and diacrylates and mono and dimethacrylates of monohydric or polyhydric alcohols, such as ethylene glycol, di-, tri-, tetra- or polyethylene glycols, the latter preferably having from 10 to 15 ethylene glycol units, 1,3-propane diol, 1,6-hexane diol, dodecane diol, glycerol, 1,1,1-trimethylol propane, 1,2,4-butanetriol, or pentaerythritol, for example, ethylene glycol monomethacrylate, 1,3-propanediol monomethacrylate, hexanediol diacrylate, hexanediol dimethacrylate, 2-ethyl-hexylacrylate, lauryl methacrylate, stearyl methacrylate, glycerol mono or diacrylate, 1,2,4-butanetriol monomethacrylate, pentaerythritol triacrylate, polyethylene glycol methyl ether acrylate, tetradecaethylene glycol dimethacrylate or the triether of glycerol and 3 mols of N-methylol acrylamide or methacrylamide. The amount of monomers contained in the layer is, in general, from about 1 to 70% by weight, preferably from about 2 to 50% by weight, of the non-volatile constituents of the composition.

Photoinitiators which can be used are the known compounds which exhibit sufficient thermal stability in the processing of recording materials and which form a sufficient number of free radicals, when exposing and thereby initiating polymerization of the monomers. The photoinitiators should absorb light in the wavelength region from about 250 to 500 nm, forming radicals in the process. Examples of preferred photoinitiators are acyloins and the derivatives thereof, such as benzoin, benzoin alkylethers, for example, benzoin isopropyl ether, vicinal diketones and the derivatives thereof, for example, benzil, benzil acetals such as benzil dimethyl ketal, fluorenones, thioxanthones, polynuclear quinones, acridines and quinoxalines; and also trichloromethyl-s-triazines, 2-halomethyl-4-vinyl-1,3,4-oxadiazole derivatives, halogen-containing oxazoles substituted by trichloromethyl groups, carbonyl methylene heterocycles containing trihalomethyl groups, according to DE-A 33 33 450, acyl phosphine oxide compounds as described, for example, in DE-A 31 33 419 and other phosphorus-containing photoinitiators, for example, the 6-acyl-(6H)-dibenz-[c,e][1,2]-oxaphosphorin-6-oxides, in particular 6-(2,4,6-trimethylbenzoyl)-(6H)-dibenz-[c,e][1,2]-oxaphosphorin-6-oxide described in German patent application P 38 27 735.2. The photoinitiators can also be used in combination with one another or with coinitiators or activators, respectively, for example, with Michler's ketone and its derivatives or with 2-alkyl anthraquinones. The amount of photoinitiator is, in general, from about 0.01 to 10% by weight, preferably from about 0.5 to 5% by weight, of the layer.

The compositions which are crosslinkable by photopolymerization can be used for the preparation of relief and flexographic printing plates by way of casting from a solution or extruding and calendering to form layers having a thickness of about 0.02 to 10 mm, preferably about 0.2 to 6 mm. The layer can be laminated to the surface of an appropriate support or a solution of the composition can be applied to a layer support.

The above-indicated layers are not only used for the production of relief printing plates, but also for the production of, for example, planographic printing plates, gravure cylinders, screen printing stencils, and photoresists.

Depending on the intended application, preferred supports comprise, for example, polyester films, steel or aluminum sheets, copper cylinders, supports for screen printing stencils, foam layers, rubber-elastic supports, or circuit boards. It may also be advantageous to apply a covering or protective layer, for example, a thin layer of polyvinyl alcohol or polyamide, or a peelable covering film, for example, of polyethylene terephthalate, to the photosensitive recording layer. Moreover, precoating of the support may be advantageous. The additional layer between the support and the photosensitive layer may act, for example, as an anti-halation layer or as an adhesive layer.

The invention also relates to a process for the production of photopolymerization-crosslinked relief forms. In the process, the layers which are crosslinkable by photopolymerization are imagewise exposed to the actinic light of light sources such as mercury vapor lamps or fluorescent tubes, the emitted wavelength ranging between about 230 and 450 nm, preferably between about 300 and 420 nm. The non-exposed and thus non-crosslinked portions of the layer are removed with the aid of the developing solvent according to the present invention, by spraying, washing or brushing. The developed relief forms are appropriately dried at temperatures up to about 120° C and may be post-exposed to actinic light, either simultaneously or subsequently.

The photopolymerization-crosslinked relief forms according to the invention are advantageously used in the production of printing forms, especially letterpress and relief printing forms, which are particularly suitable for flexographic printing. The invention is explained by the examples below.

EXAMPLE 1

A commercial flexographic printing plate based on a styrene-isoprene-styrene three-block polymer ((R)Cyrel HL) as an elastomer having a layer thickness of 2.8 mm was first subjected to overall exposure from the back for 76 seconds, using a commercial fluorescent-tube exposure apparatus and thereafter exposed imagewise from the front for 12 minutes, through a negative transparency placed in contact with it. The plate exposed in this manner was then developed in a commercial developing apparatus equipped with brushes, using a mixture of aromatic hydrocarbons according to the general formula I, having the composition indicated below and containing an amount of 15% by weight butanol. The developing time to achieve optimum results was 5 minutes.

The flexographic printing form was then dried for 2 hours at 60° C. and stored for 15 hours at room temperature. After a conventional post-treatment using an aqueous bromine solution, a flexographic printing form of excellent quality was obtained.

Composition of the mixture comprising aromatic hydrocarbons.
  2.7% of a mixture of n-propyl benzene and iso-propylbenzene,
  21.5% of a mixture of various isomeric methylethylbenzenes,
  50.6% of a mixture of various isomeric trimethylpbenzenes,
  2 6% of indan,
  4.1% of a mixture of various isomeric dimethylethylbenzenes,
  2.5% of butylbenzene and
  16 % of a mixture of various alkylbenzenes having from 9 to 11 carbon atoms.

EXAMPLE 2

A commercial flexographic printing plate was exposed as in Example 1. The exposed plate was then developed in a commercial developing apparatus, using the mixture of aromatic hydrocarbons of Example 1, to which 15% by weight of 2-ethylbutanol-(1) had, however, been added. The developing time to achieve optimum results was 5 minutes. The flexographic printing form was then post-treated as in Example 1. A flexographic printing plate of excellent quality was obtained.

EXAMPLE 3

After peeling off the covering layer from a commercial flexographic printing plate according to Example 1 (plate size 18×3 cm), the plate was uniformly brushed for 5 minutes in 50 ml of 1,3,5-trimethylbenzene. After drying and storing as described in Example 1, a residual layer thickness of 1.28 mm was obtained.

Residual layer thickness - in combination with time available for developing - is a measure of developing speed. The smaller the residual layer thickness of the originally 2.8 mm thick layer, the higher is the developing speed of the solvent used.

EXAMPLE 4

The procedure of Example 3 was followed, with the exception that 4-isopropyltoluene was used as the developing solvent. The residual layer thickness was 1.27 mm.

EXAMPLE 5

The procedure of Example 3 was followed, with the exception that a mixture of aliphatically substituted aromatic compounds, as described in Example 1, was used as the developing solvent. The residual layer thickness was 0.88 mm.

EXAMPLE 6

The procedure of Example 5 was followed, with the exception that the solvent mixture of Example 2 was used. The residual layer thickness was 0.4 mm.

EXAMPLE 7

(Comparative Example)

A flexographic printing plate was exposed and developed as described in Example 3, but in this case, limonene was used as the developing solvent. The residual layer thickness which could be determined was 1.53 mm.

EXAMPLE 8

A flexographic printing plate according to Example 1 was subjected to overall exposure from the back for 76 seconds and was then exposed from the front for 8 minutes, using a negative transparency. After removing the covering layer, the plate (diameter 30 mm) was placed for 5 minutes in 50 ml of mesitylene (1,3,5-trimethyltoluene). The plate was thereafter wiped, dried for 2 hours at 60° C. and stored for 17 hours. An increase in weight of the layer of 1.97% could be determined.

EXAMPLE 9

The procedure indicated in Example 8 was followed, with the exception that tetralin was used as the developing solvent. In this case, the increase in weight was 3.59%.

EXAMPLE 10

The procedure described in Example 8 was followed, with the exception that the solvent mixture of Example 1 was used as the developing solvent. The increase in weight was 2.7%.

EXAMPLE 11

(Comparative Example)

The procedure described in Example 8 was followed, however, using perchloroethylene as the developing solvent. The increase in weight of the layer after developing and drying was 4.3%.

EXAMPLE 12

To determine the capability (capacity) of developing solvents to take up components from non-crosslinked regions of a flexographic printing plate (®Cyrel HL), the viscosities of various developing solvents were measured at different solids contents produced by components from the layer after development of a plate containing a three-block copolymer of styrene/isoprene/styrene as the elastomer.

Table 1 shows the viscosity values determined in an Ubbelohde viscometer at 25° C., for solids contents of 5, 7.5 and 10% by weight. Although the developing solvents of the present invention exhibited a viscosity which allowed a very high developing speed at a solids content of 7.5% by weight, viscosity of perchloroethylene at a solids content in the developing solvent of only 5% by weight was already so high that rapid development was no longer ensured.

TABLE 1

| Developing Solvent | Viscosities [cSt] at Different Solids Contents [% by weight] | | |
|---|---|---|---|
|  | 5 | 7.5 | 10 |
| 1,3,5-trimethylbenzene (mesitylene) | 11.4 | 26.5 | 60 |
| 4-isopropyltoluene | 15.8 | 35.4 | 76 |
| mixture of Example 1 | 15 | 35.5 | 77 |
| perchloroethylene | 37.1 | 120.8 | 333.5 |

EXAMPLE 13

A commercial flexographic printing plate based on nitrile rubber (®Cyrel LP), which is suitable for printing with mineral oil base inks, was treated for 15 minutes as indicated in Example 6. The residual layer thickness was 0.6 mm.

EXAMPLE 14

(Comparative Example)

A commercial flexographic printing plate (®Cyrel LP) was treated as specified in Example 13. The developing solvent used was, however, limonene. The plate could not be developed.

EXAMPLE 15

(Comparative Example)

A commercial flexographic printing plate was treated as in Example 13. However, the developing solvent used comprised perchloroethylene together with 15% by weight n-butanol. After a developing time of 15 minutes, the residual layer thickness was 1.21 mm.

What is claimed is:

1. A process for the production of photopolymerization-crosslinked relief forms, which comprises the steps of imagewise exposing to actinic light, layers which are crosslinkable by photopolymerization, said layers comprising a binder based on an elastomeric polymer, a photopolymerizable monomer compatible therewith and a photoinitiator, and washing off the non-crosslinked portions of said layers with a developing solvent, said developing solvent comprising in admixture (a) about 55 to 90% by weight of at least one aromatic compound of the general formula I

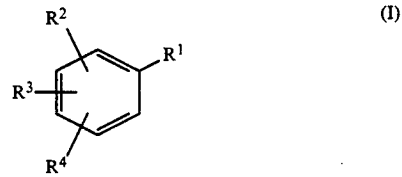

wherein $R^1$ to $R^4$ are the same or different and denote hydrogen, ($C_1$–$C_5$)n-alkyl or iso-alkyl and $R^1$ and $R^2$, provided that said $R^1$ and $R^2$ are directly adjacent, may also form a cycloaliphatic or aromatic ring having 5 or 6 carbon atoms as ring members which are non-substituted or substituted, provided that the sum of carbon atoms of all substituents and ring members is from 9 to 13, and (b) an alcohol selected from the group consisting of butanol and 2-ethyl butanol-(1).

2. A process as recited in claim 1, further comprising the steps of drying at temperatures of up to about 120° C. said relief form, and simultaneously or subsequently post-exposing said relief form to actinic light.

3. A process as recited in claim 1, wherein said alcohol is butanol.

4. A process as recited in claim 1, wherein said alcohol is 2-ethyl butanol-(1).

5. A process as recited in claim 1, wherein the binder comprises a nitrile rubber.

6. A process as recited in claim 1, wherein the developing solvent comprises an aromatic compound of the general formula I, wherein the sum of carbon atoms of all substituents and ring members is from 9 to 11.

7. A process as recited in claim 1, wherein the developing solvent comprises an aromatic compound of the general formula I, wherein the sum of carbon atoms of all substituents and ring members is 9.

8. A process as recited in claim 1, wherein the developing solvent comprises an aromatic compound of the general formula I, wherein the sum of carbon atoms of all substituents and ring members is 10.

9. A process as recited in claim 1, wherein the developing solvent comprises an aromatic compound of the general formula I, wherein the radicals $R^1$ and $R^2$ are independently hydrogen, ($C_1$–$C_5$)n-alkyl, or isoalkyl.

10. A process as recited in claim 1, wherein the developing solvent comprises an aromatic compound of the general formula I, wherein the radicals $R^1$ and $R^2$ form a ring.

11. A process as recited in claim 10, wherein the ring is an indan or indene ring.

12. A process as recited in claim 1, wherein the elastomeric polymer is a polymer of conjugated aliphatic dienes.

13. A process as recited in claim 1, wherein the photopolymerizable monomer has one or more polymerizable olefinic double bonds.

14. A process as recited in claim 1, wherein the layers comprise 30 to 95% by weight of binder, and 0.01 to 10% by weight of photoinitiator.

15. A process as recited in claim 1, wherein the actinic light has an emitted wavelength of between 230 and 450 nm.

16. A process as recited in claim 1, wherein the developing solvent comprises a mixture of aromatic compounds of the general formula I.

17. A process as recited in claim 1, wherein the elastomeric polymer comprises a styrene-isoprene-styrene block polymer.

* * * * *